(12) United States Patent
Li et al.

(10) Patent No.: US 7,651,885 B2
(45) Date of Patent: Jan. 26, 2010

(54) ELECTRONIC DEVICE FABRICATION PROCESS

(75) Inventors: Yuning Li, Mississauga (CA); Beng S. Ong, Mississauga (CA); Yiliang Wu, Mississauga (CA)

(73) Assignee: Xerox Corporation, Stamford, CT (US)

( * ) Notice: Subject to any disclaimer, the term of this patent is extended or adjusted under 35 U.S.C. 154(b) by 317 days.

(21) Appl. No.: 11/303,535

(22) Filed: Dec. 16, 2005

(65) Prior Publication Data
US 2007/0141747 A1 Jun. 21, 2007

(51) Int. Cl.
H01L 51/40 (2006.01)
(52) U.S. Cl. .................. 438/99; 257/E21.007; 257/642
(58) Field of Classification Search .................. 438/99, 438/782; 257/642, 643, E21.007, 40
See application file for complete search history.

(56) References Cited

U.S. PATENT DOCUMENTS

| | | | |
|---|---|---|---|
| 5,854,139 A * | 12/1998 | Aratani et al. ............... 438/780 | |
| 6,203,933 B1 | 3/2001 | Nakaya et al. | |
| 6,278,127 B1 | 8/2001 | Dodabalapur et al. | |
| 6,284,562 B1 | 9/2001 | Batlogg et al. | |
| 6,465,648 B1 * | 10/2002 | Tadokoro et al. ............. 544/225 | |
| 6,558,219 B1 | 5/2003 | Burroughes et al. | |
| 6,720,572 B1 | 4/2004 | Jackson et al. | |
| 6,853,127 B1 | 2/2005 | Eccleston et al. | |
| 6,864,396 B2 | 3/2005 | Smith et al. | |
| 2003/0136964 A1 * | 7/2003 | Afzali-Ardakani et al. .... 257/72 | |
| 2003/0227014 A1 | 12/2003 | Murti et al. | |
| 2003/0228718 A1 | 12/2003 | Murti et al. | |
| 2004/0075124 A1 * | 4/2004 | Wu et al. ..................... 257/288 |
| 2004/0135131 A1 * | 7/2004 | Treacher et al. .............. 252/582 |
| 2005/0017237 A1 | 1/2005 | Ong et al. |
| 2005/0017311 A1 | 1/2005 | Ong et al. |
| 2005/0040394 A1 | 2/2005 | Wu et al. |
| 2005/0043504 A1 | 2/2005 | Wu et al. |
| 2006/0186401 A1 * | 8/2006 | Marks et al. ................... 257/40 |
| 2007/0023748 A1 * | 2/2007 | Vogel et al. .................... 257/40 |

OTHER PUBLICATIONS

WO03006573, Kathirgamanathan et al., Electroluminescent Materials and Devices, Jan. 23, 2003.*
Chen et al. "A novel organic n-type material: fluorinated perylene diimide", Solar Energy Materials and Solar Cells vol. 87, pp. 521-527 (2005).*
A. R. Brown et al., "Logic Gates Made From Polymer Transistors and Their Use in Ring Oscillators," *Science*, vol. 270, pp. 972-974 (1995).
A. R. Brown et al., "Precursor Route Pentacene Metal-Insulator-Semiconductor Field-Effect Transistors," *J. Appl. Phys.*, vol. 79, No. 4, pp. 2136-2138 (1996).

(Continued)

*Primary Examiner*—W. David Coleman
*Assistant Examiner*—Sonya D McCall-Shepard
(74) *Attorney, Agent, or Firm*—Carter, DeLuca, Farrell & Schmidt, LLP

(57) ABSTRACT

A process for fabricating an electronic device including: (a) forming a liquid composition using starting ingredients comprising an organic semiconductor and a stabilizer, wherein the stabilizer comprises a strong electron donor compound or a strong electron acceptor compound, wherein the organic semiconductor exhibits a high oxygen sensitivity in a comparison solution without the stabilizer but a lower oxygen sensitivity in the liquid composition; (b) liquid depositing the liquid composition; and (c) drying the liquid composition to form a layer of the electronic device, wherein the layer comprises the organic semiconductor.

18 Claims, 3 Drawing Sheets

OTHER PUBLICATIONS

K. P. Weidkamp et al., "A Photopatternable Pentacene Precursor for Use in Organic Thin-Film Transistors," *J. Am. Chem. Soc.*, vol. 126, pp. 12740-12741 (Published on Web Sep. 16, 2004).

Beng S. Ong et al., "High-Performance Semiconducting Polythiophenes for Organic Thin-Film Transistors," *J. Am. Chem. Soc.*, vol. 126, No. 11, pp. 3378-3379 (published on web Mar. 2, 2004).

Chowdhury et al., "Entropy Changes and Electron Affinities from Gas-Phase Electron-Transfer Equilibria: A−+B=A+B−", *J. Phys. Chem.*, 90, pp. 2747-2752 (1986).

Dimitrakopoulos et al., "Organic Thin Film Transistors for Large Area Electronics", *Adv. Mater.*, 14, No. 2, pp. 99-117 (2002).

Heeney et al., "Stable Polythiophene Semiconductors Incorporating Thienol[2,3-*b*]thiophene", *J. Am. Chem. Soc.*, 127, pp. 1078-1079 (2005).

\* cited by examiner

ELECTRONIC DEVICE FABRICATION PROCESS

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND

Organic semiconductors, including pentacene derivatives and polythiophenes, are useful as charge-transporting materials in thin film transistors (TFTs), diodes, photovoltaic devices, and the like. The semiconductors, which are soluble in organic solvents, may be fabricated for use in these electronic devices by liquid deposition processes. Their ability to be fabricated via common liquid deposition processes allows for simple and cost effective manufacturing as compared to costly conventional photolithographic processes utilized in the production of silicon-based devices, such as hydrogenated amorphous silicon TFTs.

Moreover, organic semiconductors have excellent durability and flexibility characteristics, permitting the fabrication of flexible semiconductor components on flexible plastic substrates, thereby enabling creation of mechanically durable and structurally flexible electronic devices. These soluble organic semiconductors are particularly valuable in the manufacture of large image sensors, flat-panel displays, electronic paper and other large-area electronic devices. These organic semiconductors may also find application in low-cost microelectronics such as smart cards, radio frequency identification (RFID) tags, and memory/storage devices where the high costs of packaging silicon circuits may become limiting.

However, most organic semiconductors are prone to interaction with atmospheric oxygen, particularly when exposed to light. For example, p-type semiconductors such as pentacene readily react with atmospheric oxygen in the presence of UV and visible light, leading to severe degradation of its semiconductor properties. Similarly, oxygen is also an excellent electron trap for n-type organic semiconductors, and may prevent them from functioning properly as electron transporting media. Accordingly, when working with many organic semiconductor materials, rigorous precautions have to be undertaken during processing and device fabrication to exclude environmental oxygen and/or light to avoid or minimize these degradative effects. These precautionary measures add to the cost of manufacturing, offsetting the appeal of organic semiconductor devices as a low-cost alternative to amorphous silicon devices, particularly for large-area device applications.

The following documents provide background information:

A. R. Brown et al., "Logic Gates Made From Polymer Transistors and Their Use in Ring Oscillators," *Science*, Vol. 270, pp. 972-974 (1995).

A. R. Brown et al., "Precursor Route Pentacene Metal-Insulator-Semiconductor Field-Effect Transistors," *J. Appl. Phys.*, Vol. 79, No. 4, pp. 2136-2138 (1996).

K. P. Weidkamp et al., "A Photopatternable Pentacene Precursor for Use in Organic Thin-Film Transistors," *J. Am. Chem. Soc.*, Vol. 126, pp. 12740-12741 (Published on Web Sep. 16, 2004).

Beng S. Ong et al., "High-Performance Semiconducting Polythiophenes for Organic Thin-Film Transistors," *J. Am. Chem. Soc.*, Vol. 126, No. 11, pp. 3378-3379 (published on web Mar. 2, 2004).

The conventional approaches for improving the stability of organic semiconductors often lead to compromises on other desirable characteristics of the semiconductors including for instance transistor mobility, processability, reproducibility, and the like.

Therefore, there is a need, which is addressed by embodiments of the present invention, for simple and reproducible methods to stabilize organic semiconductor materials during processing to avoid or minimize performance degradation when fabricating electronic devices under ambient conditions.

SUMMARY

In embodiments, there is provided a process for fabricating an electronic device comprising:
(a) forming a liquid composition using starting ingredients comprising an organic semiconductor and a stabilizer, wherein the stabilizer comprises a strong electron donor compound or a strong electron acceptor compound, wherein the organic semiconductor exhibits a high oxygen sensitivity in a comparison solution without the stabilizer but a lower oxygen sensitivity in the liquid composition;
(b) liquid depositing the liquid composition; and
(c) drying the liquid composition to form a layer of the electronic device, wherein the layer comprises the organic semiconductor.

In further embodiments, there is provided a process for fabricating an electronic device comprising:
(a) forming a liquid composition using starting ingredients comprising a p-type organic semiconductor and a strong electron acceptor compound, wherein the p-type organic semiconductor exhibits a high oxygen sensitivity in a comparison solution without the strong electron acceptor compound but a lower oxygen sensitivity in the liquid composition;
(b) liquid depositing the liquid composition; and
(c) drying the liquid composition to form a layer of the electronic device, wherein the layer comprises the p-type organic semiconductor.

In other embodiments, there is provided a process for fabricating a semiconductor layer of a thin film transistor comprising:
(a) forming a liquid composition using starting ingredients comprising a p-type organic semiconductor and a strong electron acceptor compound, wherein the p-type organic semiconductor exhibits a high oxygen sensitivity in a comparison solution without the stabilizer but a lower oxygen sensitivity in the liquid composition;
(b) liquid depositing the liquid composition; and
(c) drying the liquid composition to form the semiconductor layer of the thin film transistor, wherein the semiconductor layer comprises the p-type organic semiconductor.

DESCRIPTION OF THE FIGURES

Various embodiments of the present disclosure will be described herein below with reference to the figures wherein.

EMBODIMENTS

Figure 1:
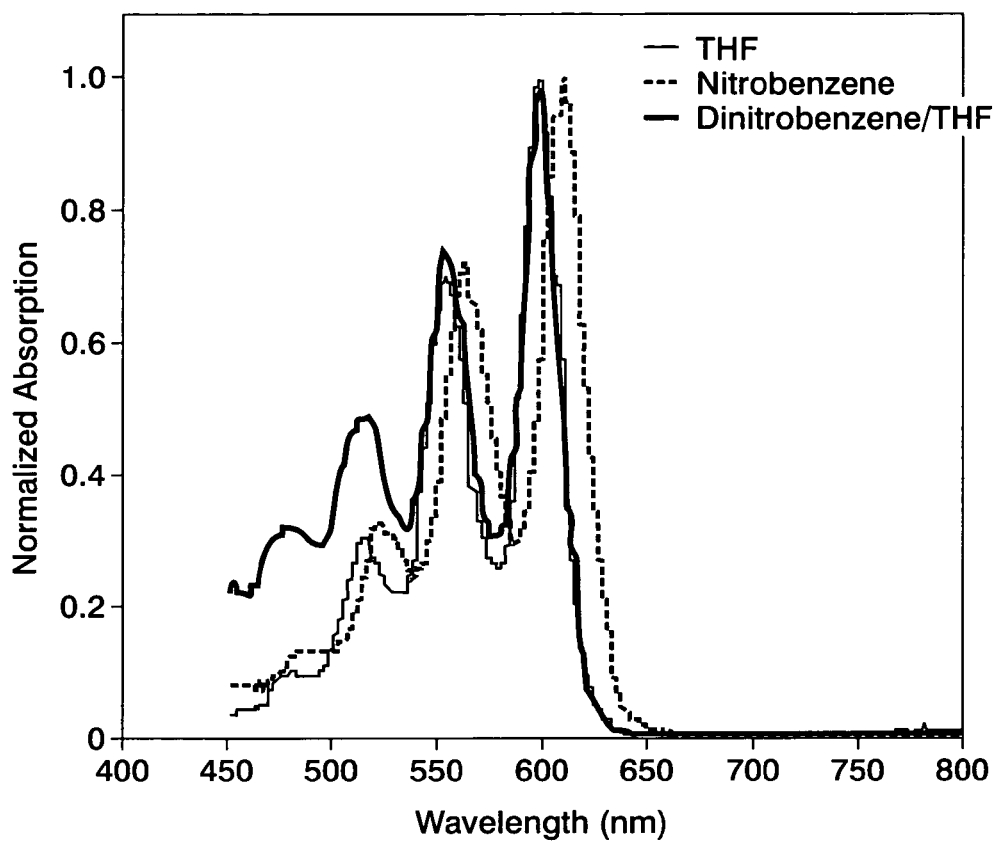
FIG. 1 is a graph depicting UV-vis spectra of compositions of 6,1 3-bis(4-butylphenyl)pentacene: in tetrahydrofuran ("THF"); in nitrobenzene; and in 1,4-dinitrobenzene/THF.

To form the liquid composition, the starting ingredients comprise an organic semiconductor and a stabilizer, wherein the stabilizer comprises a strong electron donor compound or a strong electron acceptor compound. In embodiments, there is an interaction between the stabilizer and the organic semiconductor to provide the stabilization effect.

The phrase "liquid composition" encompasses for instance a solution and a dispersion of the components of the "liquid composition".

The term "a" such as in "a strong electron donor compound" and "a strong electron acceptor compound" indicates one, two, three or more compounds.

The stabilizer comprises a strong electron donor compound or a strong electron acceptor compound, wherein the term "or" indicates that both the strong electron donor compound and the strong electron acceptor compound are not simultaneously used in the liquid composition. It is understood, however, that embodiments of the present process include for instance the following: (1) depending upon a particular organic semiconductor, each of the strong electron donor compound and the strong electron acceptor compound can provide a stabilization effect (that is, lowering the oxygen sensitivity of the organic semiconductor where oxygen sensitivity is defined by half-life time as discussed herein); and (2) depending upon a particular organic semiconductor, only one of the strong electron donor compound and the strong electron acceptor compound can provide a stabilization effect, wherein the other does not provide a stabilization effect.

Typically, organic semiconductors may be classified as n-type or p-type. However, because certain semiconductors may have both n-type and p-type properties, such semiconductors may be classified under either category depending for example on the particular device incorporating the semiconductor and on the applied field. Where the present claims recite the category (that is p-type or n-type), one can refer for instance to the representative organic semiconductors described herein to determine whether a particular organic semiconductor is considered a p-type or n-type for purposes of those claims. For an n-type semiconductor, a strong electron donor compound is used to stabilize it; while for a p-type semiconductor, a strong electron acceptor is used for the stabilization.

In embodiments, the p-type organic semiconductor has a HOMO (highest occupied molecular orbital) level ranging for example from about 4.0 eV to about 6.0 eV, or from about 4.5 eV to about 6.0 eV relative to vacuum. In embodiments, the n-type organic semiconductor has a LUMO (lowest unoccupied molecular orbital) level ranging for example from about 2.0 eV to 5.0 eV, or from about 2.5 eV to about 5.0 eV. The HOMO and LUMO levels of an organic semiconductor can be determined by using known techniques in the field such as for example cyclic voltammetry, UV photoelectron spectroscopy, etc.

The present disclosure provides in embodiments methods for stabilizing organic semiconductors, such as p-type or n-type organic semiconductors, by contacting the semiconductor with a stabilizer. Stabilization of the organic semiconductor reduces its sensitivity to oxygen, which is critically important during the fabrication of electronic devices comprising a semiconductor material under ambient conditions since such stabilization reduces or minimizes the effect of ambient oxygen on device performance. In embodiments, a stabilizer refers to for example an electron acceptor compound if the organic semiconductor is of p-type, or an electron donor compound if the organic semiconductor is of n-type.

The method of the present disclosure involves creating a stable semiconductor composition by combining the organic semiconductor with one or more stabilizers in an optional solvent (a separate solvent is optional since the stabilizer may be in embodiments a solvent).

p-Type organic semiconductors which may be utilized include acenes such as substituted naphthacene (tetracene) and substituted pentacene, and conjugated oligomers and polymers such as oligothiophenes and polythiophenes, and the like. In embodiments, acenes suitable for use as semiconductors include substituted naphthacene (tetracene) and higher acenes that are substituted with one or more substituents of, for example, alkyl, aryl, alkoxy, dialkylamino, diarylamino, and the like. Examples of substituted acenes include 5,6,11,12-tetraalkylnaphthacene such as 5,6,11,12-tetraethylnaphthacene, 5,6,11,12-tetrapropylnaphthacene, 5,6,11,12-tetrabutylnaphthacene, 5,6,11,12-tetrapentylnaphthacene, 5,6,11,12-tetrahexylnaphthacene, 5,6,11,12-tetraheptylnaphthacene, 5,6,11,12-tetrahexylnaphthacene, and the like, 5,6,11,12-tetraarylnaphthacenes such as 5,6,11,12-tetraphenylnaphthacene (rubrene), 5,6,11,12-tetratolylnaphthacene, 5,6,11,12-tetra(ethylphenyl)naphthacene, 5,6,11,12-tetra(propylphenyl)naphthacene, 5,6,11,12-tetra(butylphenyl)naphthacene, 5,6,11,12-tetra(bromophenyl)naphthacene, 5,6,11,12-tetra(chlorophenyl)naphthacene, 5,6,11,12-tetra(fluorophenyl)naphthacene, 5,12-dimethoxy-6,11-diphenylnaphthacene, 5,12-dimethoxy-6,11-ditolylnaphthacene, 5,12-dimethoxy-6,11-di(ethylphenyl)naphthacene, 5,12-dimethoxy-6,11-di(propylphenyl)naphthacene, 5,12-dimethoxy-6,11-di(butylphenyl)naphthacene, and the like, 6,13-dialkylpentacenes such as 6,13-dihexylpentacene, 6,13-dioctylpentacene, 6,13-didodecylpentacene, and the like, 6,13-diarylpentacenes such as 6,13-diphenylpentacene, 6,13-bis(4-butylphenyl)pentacene, 6,13-bis(4-hexylphenyl)pentacene, 6,13-bis(4-octylphenyl)pentacene, and the like, and others such as 1,4,8,11-tetramethylpentacene, 2,9-dihexylpentacene, 2,10-dihexylpentacene, 2,9-dinonylpentacene, 2,10-dinonylpentacene, 2,9-didodecylpentacene, 2,10-didodecylpentacene, 2,9-di-sec-butylpentacene, 2,10-di-sec-butylpentacene, 2,9-di-3,5,5-trimethylhexylpentacene, 2,10-di-3,5,5-trimethylhexylpentacene, 2,9-di-2-ethylhexylpentacene, and 2,10-di-2-ethylhexylpentacene, and the like.

n-Type organic semiconductors which may be utilized include α,ω-di(perfluoroalkyl)substituted oligothiophenes such as α,ω-diperfluorohexylquaterthiophene, α,ω-diperfluorohexylquinquethiophene, α,ω-diperfluorohexylsexithiophene, αω-diacyl substituted oligothiophenes such as α,ω-diheptanoylquaterthiophene, α,ω-diperfluorohexylcarbonylquaterthiophene, substituted arylenetetracarboxylic diimides such as naphthalenetetracarboxylic diimide and perylenetetracarboxylic diimide, metal perfluorophthalocyanines such as copper (II) perfluorophthalocyanine, and the like.

Additional p- and n-type organic semiconductors which may be utilized are disclosed in "Organic Thin Film Transistors for Large Area Electronics" by C. D. Dimitrakopoulos and P. R. L. Malenfant, Adv. Mater., Vol. 12, No. 2, pp. 99-117 (2002), the entire content of which is incorporated by reference herein.

The oxygen sensitivity of organic semiconductors in the liquid compositions of the present disclosure can be followed by UV-vis spectroscopic measurement and compared to those of the organic semiconductor solutions without a stabilizer (herein referred to as comparison solution). Oxygen sensitivity of organic semiconductors can be estimated by their half-life times in the liquid compositions and in the comparison solutions. In embodiments, the half-life time in the liquid composition is defined as the time it takes for the absorbance in the UV-vis spectrum to decrease to half of its original value when the compositions are stored under ambient conditions. The "ambient conditions" are defined here as at a temperature of from about 20 degree C. to about 25 degree C. under fluorescent light in the air.

The organic semiconductors in the comparison solutions generally exhibit high oxygen sensitivity as characterized by a half-life time of for example less than 200 minutes. In embodiments, the organic semiconductors in the liquid compositions of the present disclosure exhibit lower oxygen sensitivity with a half-life time of for example more than 200 minutes. The increase in half-life time for the organic semiconductor in the liquid composition of the present disclosure is generally more than 100% over those of comparison solutions without the stabilizer.

Solvents which are used in the comparison solution can be any solvents that have no ability in stabilizing the organic semiconductor against degradative effects of oxygen. These solvents include, for example, tetrahydrofuran (THF), toluene, xylene, and the like, and a mixture thereof.

When performing UV-vis spectroscopic measurements, the concentration of the organic semiconductor in the liquid composition and comparison solution is kept in a range at which the absorbance of interest fall within the observable scale of the instrument. This is usually in a range of, for example, about 1 mg to about 10 mg per liter of solvent. The concentration of the organic semiconductor suitable for the UV-vis measurement varies depending on the organic semiconductor used.

One or more strong electron acceptor compounds may be used to stabilize p-type semiconductors in the liquid compositions of the present disclosure. In embodiments, a strong electron acceptor compound generally possesses one or more electron withdrawing groups such as, for example, nitro, fluoro, chloro, cyano, formyl, acyl, carboxylic acid, carboxylic acid anhydride, carboxylate, perfluorohydrocarbon, and the like. Illustrative strong electron acceptor compounds include nitrobenzene, fluoronitrobenzene, difluoronitrobenzene, trifluoronitrobenzene, chloronitrobenzene, chlorofluorobenzene, dichloronitrobenzene, nitrotrifluoromethylbenzene, ethylnitrobenzene, dimethylnitrobenzene, dinitrobenzene, chloronitrotoluene, nitrotoluene, fluoronitrotoluene, dinitrotoluene, nitrobenzonitrile, tetracyanoethylene (TCNE), 7,7,8,8-tetracyanoquinodimethane (TCNQ), phthalic anhydride, nitrobenzaldehyde, and the like. In embodiments, the strong electron acceptor compound has an electron affinity ranging for instance from about 0.4 eV to about 4 eV, preferably from about 0.8 eV to about 3.5 eV.

Similarly, one or more strong electron donor compounds may be utilized to stabilize n-type semiconductors in the liquid compositions of the present disclosure. In embodiments, a strong electron donor compound generally possesses one or more electron donating groups such as, for example, alkylthio, arylthio, alkoxy, aryloxy, amino, alkylamino, dialkylamino, alkylarylamino, diarylamino, and the like. Illustrative examples of electron donor compounds include optionally substituted triarylamines such as triphenylamine, 4,4'-bis-(m-tolylphenylamino)biphenyl, 4,4'-bis(1-naphthylphenylamino)biphenyl, tetrathiafulvalene and its derivatives, optionally substituted oligothiophenes such as $\alpha,\omega$-dialkylsexithiophenes, optionally substituted polythiophenes such as poly(3-hexylthiophene), poly(3,4-ethylenedioxythiophene), 4,4'-bis(carbazol-9-yl)-biphenyl, poly(N-vinylcarbazole), polyaniline, and the like. In embodiments, the strong electron donor compound has an ionization potential ranging for instance from about 3.5 to about 7 eV, preferably from about 4 to about 6 eV.

Solvents may be added to the liquid composition, particularly when the strong electron acceptor or strong donor compounds are solids at the processing temperatures such as for example from about 0° C. to about 250° C., in embodiments from about 20° C. to about 200° C. In addition, solvents can be used even when the strong electron acceptor or strong donor compounds are liquid at processing temperatures for a variety of other reasons, including cost reduction by reducing the amount of the stabilizer required. Suitable solvents for the liquid composition include, for example, water, esters, alkanes, ethers, alcohols, alkylene halides, ketones, nitrites, mixtures thereof, and the like. Examples of specific solvents which may be utilized include water, ethyl acetate, butyl acetate, hexane, heptane, octane, diethyl ether, dibutyl ether, methanol, ethanol, propanol, butanol, tetrahydrofuran, toluene, xylene, ethyl benzene, mesitylene, chlorobenzene, dichlorobenzene, methylene chloride, acetone, methyl ethyl ketone, N,N-dimethylformamide, methyl sulfoxide, methylene chloride, chloroform, N-methylpyrrolidone, acetonitrile, mixtures thereof, and the like. In embodiments, the stabilizer may act as the optional solvent.

The amount of organic semiconductor in the liquid composition may vary from about 0.5 to about 80 percent by weight of the total weight of the liquid composition, in embodiments from about 1 to about 50 percent by weight of the total weight of the liquid composition. The amount of stabilizer used may vary from about 0.5 to about 99.5 percent by weight of the total weight of the liquid composition, in embodiments from about 1 to about 99 percent by weight of the total weight of the liquid composition. If an additional solvent is used, the amount of solvent used may vary from about 10 to about 98 percent by weight of the total weight of the liquid composition, in embodiments from about 20 to about 95 percent by weight of the total weight of the liquid composition.

The stabilized semiconductor compositions (that is, the liquid composition) can be used to make components for a variety of electronic devices such as TFTs, diodes, photovoltaic devices, and the like. In embodiments, a TFT may include a substrate layer, source and drain electrodes, a dielectric layer, and a semiconductor layer. In embodiments, the substrate layer may be a silicon material inclusive of various appropriate forms of silicon such as a glass plate, a plastic film or a sheet, and the like, depending on the intended use of the semiconductor device. For structurally flexible devices, a plastic substrate including polyesters such as polyethylene terephthalate (PET), poly(ethylene naphthalate) (PEN), polyimides, polycarbonates (PC), and the like may be selected. The thickness of the substrate may be, for example, from about 10 micrometers to over 10 millimeters. A flexible plastic substrate may possess a thickness for example from about 50 to about 1000 micrometers, in embodiments from about 50 to about 500 micrometers. A rigid substrate such as glass or silicon may possess a thickness from about 0.1 to about 10 millimeters, in embodiments from about 400 to about 2000 micrometers.

The TFT may include a gate electrode which can be any conducting film such as a thin metal film, a metal oxide film (for example indium tin oxide), a conducting polymer film, a conducting film generated from a conducting ink or paste, or the substrate itself (for example heavily doped silicon). Examples of gate electrode materials include, but are not limited to, aluminum, gold, silver, copper, chromium, indium tin oxide, conducting polymers such as polystyrene sulfonate-doped poly(3,4-ethylenedioxythiophene) (PSS/PEDOT), conducting ink/pastes including carbon black/graphite or colloidal silver dispersion contained in a polymer binder, such as ELECTRODAG® (available from Acheson Colloids Company), silver filled electrically conductive thermoplastic ink (available from Noelle Industries), and the like. The gate electrode can be prepared by vacuum evaporation, sputtering of metals or conductive metal oxides, coating from conducting polymer solutions or conducting inks, by spin coating, casting, or printing of dispersions. The thickness of the gate electrode layer may be, for example, from about 10 nanometers to about 1 millimeter, in embodiments from about 10 nanometers to about 1 millimeter for metal films and about 1 micrometer to about 10 micrometers for polymeric materials.

The source and drain electrodes of a TFT can be fabricated from known materials and may be placed in contact to the semiconductor layer. Suitable materials for use as source and drain electrodes include those of the gate electrode materials such as gold, silver, copper, nickel, aluminum, platinum, conducting polymers, and conducting inks described above. The thickness of this layer can be from about 40 nanometers to about 1 micrometer, in embodiments from about 40 to about 400 nanometers.

The insulating dielectric layer, which can separate the gate electrode from the source and drain electrodes, may be in contact with the semiconductor layer and can generally be an inorganic material film, an organic polymer film, or an organic-inorganic composite film. Illustrative examples of inorganic materials suitable as the dielectric layer include metal oxides, nitrides, and titanates including silicon oxide, silicon nitride, aluminum oxide, barium titanate, barium zirconate titanate, and the like. Illustrative examples of organic polymers for the dielectric layer include polyolefins, polyesters, polystyrenes, polyxylylenes, polyalcohols, polyimides, and epoxies. Specific examples include polypropylene, poly (isobutylene), poly(methyl methacrylate) (PMMA), polystyrene, poly($\alpha$-methylstyrene), poly(p-xylylene), polyethylene terephthalate (PET), poly(vinylalcohol) (PVA), poly(vinyl phenol) (PVP), polyimide, epoxy resin, and the like; and illustrative examples of inorganic-organic composite materials include nanosized metal oxide particles such as aluminum oxide and the like dispersed in polymers such as polyester, polyimide, epoxy resin and the like. The thickness of the dielectric layer may be, for example, from about 1 nanometer to about 10 micrometers with a more specific thickness being about 100 nanometers to about 5000 nanometers.

In embodiments, between and in contact with the dielectric layer and the source/drain electrodes is an active semiconductor layer including the organic semiconductors of the present disclosure. The thickness of the semiconductor layer may be from about 10 nanometers to about 1 micrometer, in embodiments from about 30 to about 100 nanometers. This layer can be fabricated by liquid deposition processes such as spin coating, dip coating, blade coating, jet printing, screen printing, stencil printing, microcontact printing, gravure printing, or flexography. In embodiments, the liquid composition contains a p-type organic semiconductor with a strong electron acceptor compound. In embodiments, the liquid composition contains an n-type organic semiconductor with a strong electron donor compound.

After deposition of the liquid composition using a liquid deposition process, the present process dries the liquid composition. The drying of the liquid composition may be accomplished in embodiments by evaporation with or without application of heating or vacuum, thereby leaving behind the organic semiconductor in the semiconductor layer. Where heating is utilized, the liquid composition and/or the substrate may be heated to a temperature from about 40° C. to about 200° C., in embodiments from about 50° C. to about 180° C. for a time period ranging from about 30 sec to about 24 hours. In embodiments, drying of the liquid composition removes some or all of the stabilizer and the optional solvent(s). In other embodiments, a portion or all of the stabilizer may remain in the semiconductor layer after removal of solvent(s).

In embodiments, the TFT devices have a semiconductor channel width (W) of, for example, from about 5 micrometers to about 5 millimeters, from about 100 micrometers to about 1 millimeter. The semiconductor channel length (L) may be, for example, from about 1 micrometer to about 1 millimeter, in embodiments from about 2 micrometers to about 100 micrometers.

Figure 3:
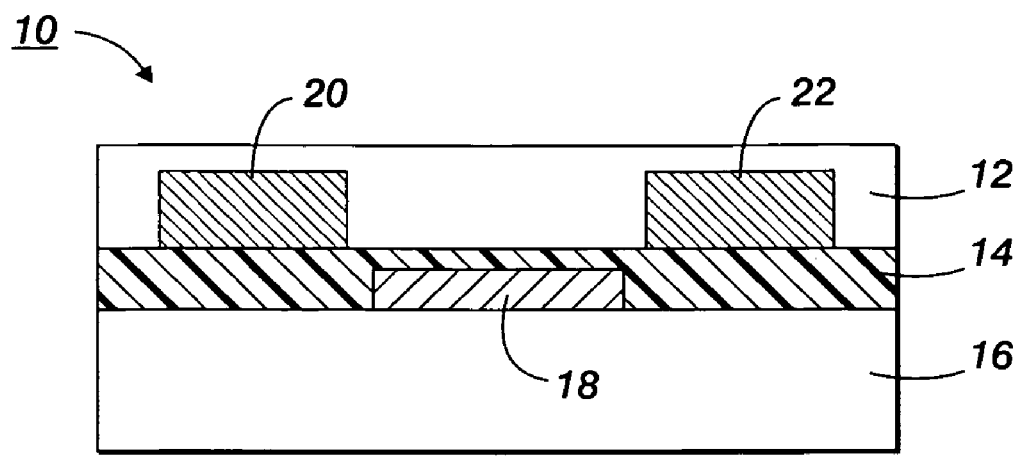
FIG. 3 is a schematic diagram of a first TFT configuration prepared from the present liquid composition comprising the organic semiconductor and the stabilizer.

Embodiments of the present disclosure are set forth below with reference to the accompanying drawings. In the following description, well-known functions or constructions are not described in detail to avoid obscuring the present disclosure in unnecessary detail. FIGS. 3-6 show a variety of TFT configurations where a semiconductor layer may be manufactured from a stabilized semiconductor composition of the present disclosure. In particular, FIG. 3 shows a TFT configuration 10 including a substrate 16 in contact with a metal contact 18 (gate electrode), and a layer of insulating dielectric layer 14 with the gate electrode 18 having a portion thereof or the entire gate in contact with the dielectric layer 14. Two metal electrodes, 20 and 22 (source and drain electrodes), are deposited on top of dielectric layer 14. A semiconductor layer of the present disclosure 12 may be placed over and between metal contacts 20 and 22. The gate electrode 18 can be included in the substrate, or in the dielectric layer.

Figure 4:
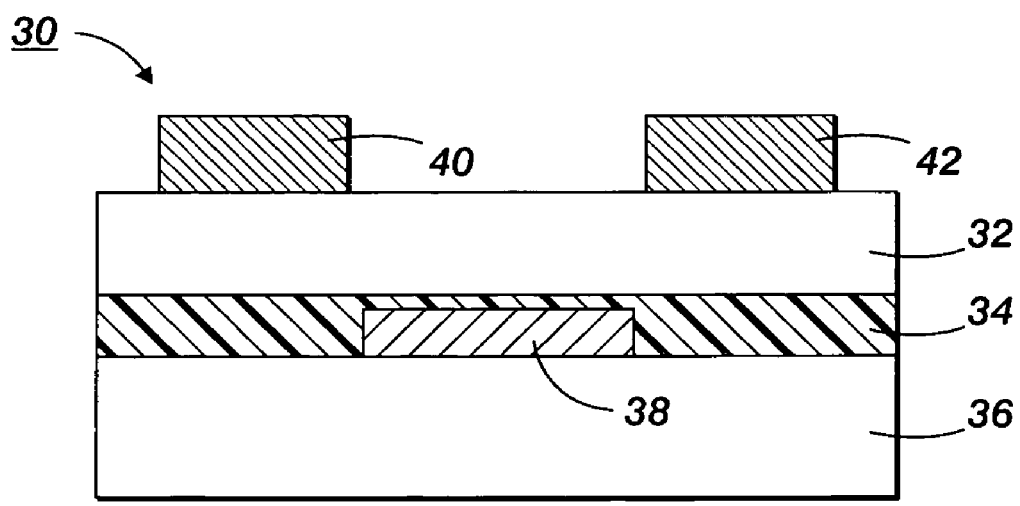
FIG. 4 is a schematic diagram of a second TFT configuration prepared from the present liquid composition comprising the organic semiconductor and the stabilizer.
Figure 5:
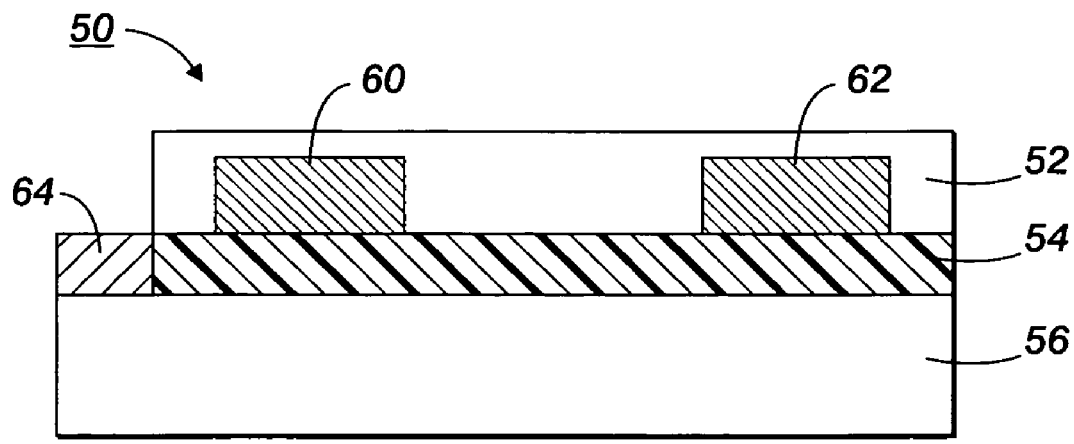
FIG. 5 is a schematic diagram of a third TFT configuration prepared from the present liquid composition comprising the organic semiconductor and the stabilizer.
Figure 6:
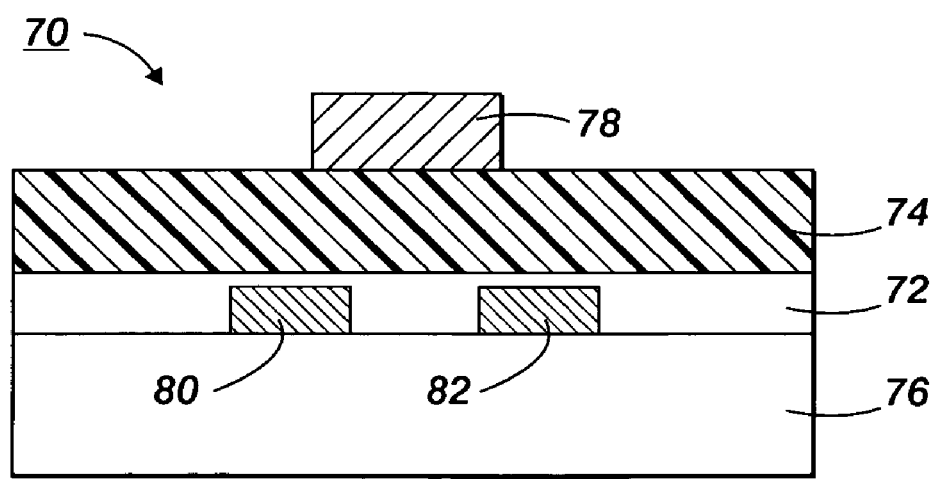
FIG. 6 is a schematic diagram of a fourth TFT configuration prepared from the present liquid composition comprising the organic semiconductor and the stabilizer.

FIG. 4 illustrates another TFT configuration 30 including a substrate 36, a gate electrode 38, a source electrode 40, a drain electrode 42, an insulating dielectric layer 34, and a semiconductor layer of the present disclosure 32. FIG. 5 shows a further TFT configuration 50 including a heavily n-doped silicon wafer substrate 56, which can act as a gate electrode, a thermally grown silicon oxide dielectric layer 54, a source electrode 60, a drain electrode 62, a semiconductor layer of the present disclosure 52, and a gate electrode contact 64. FIG. 6 illustrates a TFT configuration 70 including substrate 76, a gate electrode 78, a source electrode 80, a drain electrode 82, a semiconductor layer of the present disclosure 72, and an insulating dielectric layer 74, which may also function as a protecting layer.

The following examples illustrate embodiments of the present disclosure. The examples are intended to be illustrative only and are not intended to limit the scope of the present disclosure. Also, parts and percentages are by weight unless otherwise indicated.

EXAMPLE 1

6,13-bis(4-butylphenyl)pentacene was synthesized as follows. A solution of 1-bromo-4-butylbenzene (about 5.09 grams, about 32.40 mmol) in about 20 milliliters of anhydrous tetrahydrofuran (THF) was added over a period of about 1 hour to a stirred suspension of magnesium turnings (about 0.79 grams, about 32.40 mmol) in about 10 milliliters of THF in a 250 milliliter round-bottomed flask under an inert argon atmosphere. The resultant mixture was stirred at about 60° C. for about 2 hours. A solution of 6,13-pentacene-quinone (about 1.0 grams, about 3.24 mmol) in about 20 milliliters of THF was added and the resulting mixture was stirred at about 60° C. for about 2 hours. Subsequently, the reaction mixture was cooled to about 22° C. to about 25° C. and quenched with ice. The reaction mixture was extracted with toluene and the organic layer was separated and dried with anhydrous magnesium sulfate (MgSO4). The solvent was removed and a solution of potassium iodide (KI) (about 2.00 grams, about 12.0 mmol) in about 50 milliliters acetic acid (AcOH) was added to the solid residue. The resultant mixture was then refluxed for about 1 hour and then cooled to about 22° C. to about 25° C. A purple precipitate, obtained after filtration, was washed with water and methanol, yielding about 0.83 grams of 6,13-bis(4-butylphenyl)pentacene as a dark purple solid (about 47% yield). Further purification was conducted by sublimation. An overview of this process is set forth below in Scheme 1.

Scheme 1

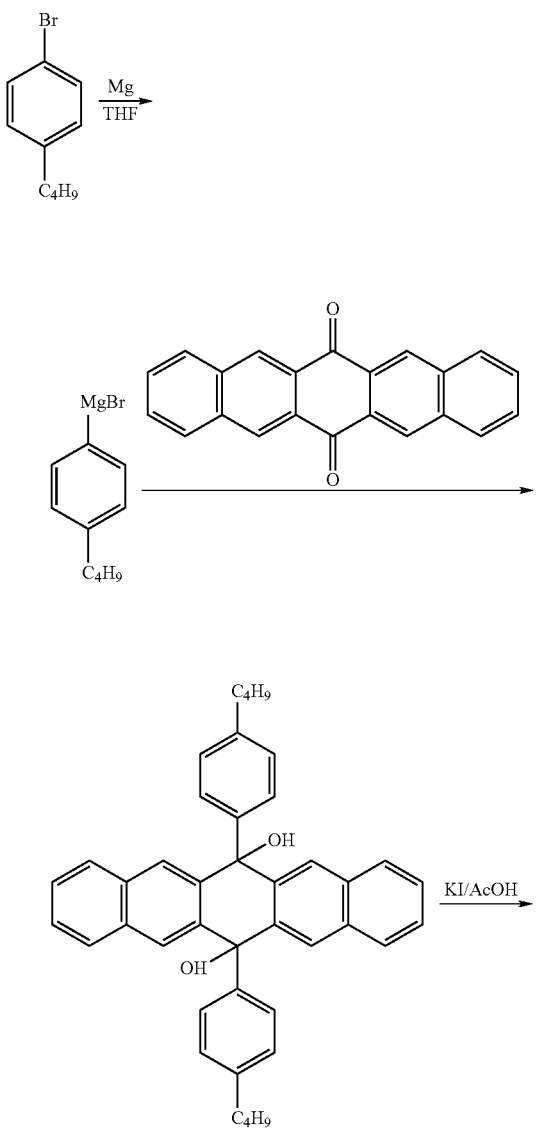

-continued

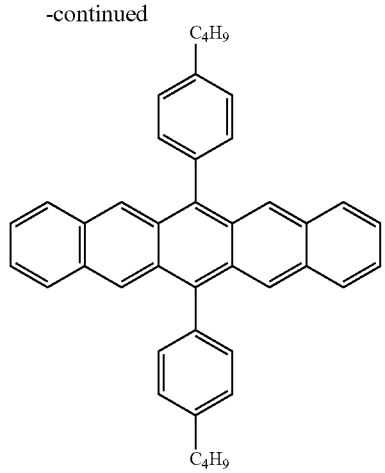

EXAMPLE 2

Three solutions were prepared by dissolving 6,13-bis(4-butylphenyl)pentacene produced in Example 1 in tetrahydrofuran (THF); nitrobenezene (acting as an electron acceptor solvent); and a mixture of 1,4-dinitrobenezene (an electron acceptor compound) and THF (about 5 to about 95 ratio by weight). The solutions had a concentration of about 1 to about 10 mg of 6,13-bis(4-butylphenyl)pentacene per liter of solvent. UV-vis absorption measurements, conducted on a Varian Cary 5 UV-Vis NIR spectrophotometer, were obtained to demonstrate the electron donor-acceptor interactions of 6,13-bis(4-butylphenyl)pentacene with the electron acceptor compound, either nitrobenzene or 1,4-dinitrobenezene (THF alone was used as a control). FIG. 1 shows the UV-vis absorption spectra of the three resulting solutions, with the THF solution showing a major absorption peak at about 598 nanometers; the nitrobenzene solution showing a major absorption peak at about 609 nanometers; and the 1,4-dinitrobenezene/THF solution showing a major absorption peak at about 599 nanometers and an extra absorption at about 688 nanometers, which can be assigned to the charge transfer transition.

Figure 2:
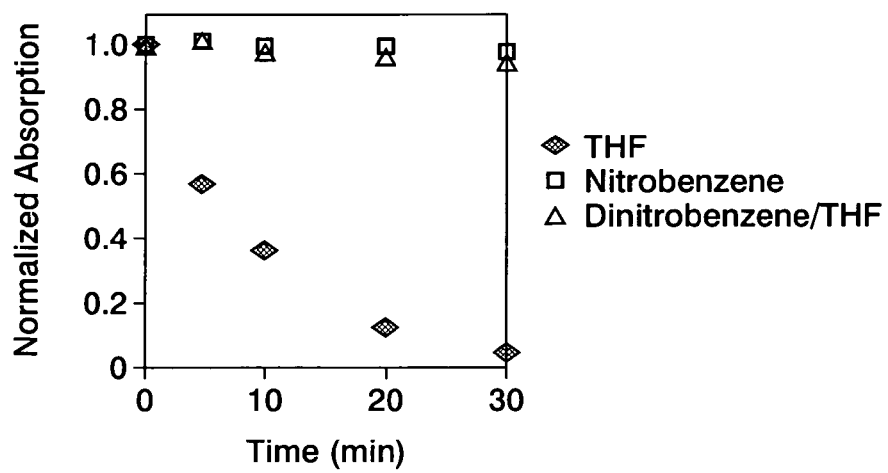
FIG. 2 is a graph depicting normalized UV-vis absorbance of 6,13-bis(4-butylphenyl)pentacene on exposure to ambient light in air as a function of time: in THF; in nitrobenzene; and in 1,4-dinitrobenzene/THF.

The spectroscopic absorption measurement was also used to determine the stability of 6,13-bis(4-butylphenyl)pentacene in these three solutions when exposed to ambient light under ambient conditions. The UV-vis absorbance of the major absorption peak (598 nanometers in THF; 608 nanometers in nitrobenzene; 599 nanometers in a mixture of 1,4-dinitrobenzene and THF) was used to monitor the change of the concentration of 6,13-bis(4-butylphenyl)pentacene. FIG. 2 shows the changes of normalized absorption intensities of the three compositions with exposure to ambient light in air over a period of about 30 minutes. The absorption of the THF solution (without an electron acceptor compound) decreased in intensity very rapidly, and dropped to about 4.1 percent of its original value in about 30 minutes, giving an estimated half-life time of about 6.5 minutes. On the other hand, the absorption of the nitrobenzene solution showed only a slight decrease in intensity, and remained at about 97.4 percent of its initial value over a period of about 30 minutes, giving an estimated half-life time of about 790 minutes. Similarly, the absorbance of 1,4-dinitrobenezene/THF solution showed also a slight decrease in intensity, and remained at about 94.1 percent of its initial value over a period of about 30 minutes, giving an estimated half-life time of about 340 minutes. These spectroscopic results demonstrate the stabilization of p-type semiconductors by the electron acceptor compounds (nitrobenzene or 1,4-dinitrobenzene).

EXAMPLE 2

The stabilization of another p-type semiconductor, rubrene (Aldrich), by acceptor compounds was demonstrated herein by similar spectroscopic measurement. Three solutions were prepared by dissolving rubrene in tetrahydrofuran (THF); nitrobenezene (acting as an electron acceptor solvent); and a mixture of 1,4-dinitrobenezene (an electron acceptor compound) and THF (about 5 to about 95 ratio by weight). The UV-vis absorbance of the major absorption peaks (526 nanometers in THF; 533 nanometers in nitrobenzene; 527 nanometers in a mixture of 1,4-dinitrobenezene and THF) were used to monitor the change of concentration of rubrene. FIG. 3 shows the changes of normalized absorption intensities of the three solutions with exposure to ambient light in air over a period of about 180 minutes to about 480 minutes. The absorption of the THF solution (without an electron acceptor compound) decreased in intensity rapidly, and dropped to about 37.6 percent of its original value in about 180 minutes, giving an estimated half-life time of about 128 minutes. On the other hand, the absorption of the nitrobenzene solution showed only a slight decrease in intensity, and remained at about 93.1 percent of its initial value over a period of about 180 minutes, giving an estimated half-life time of about 1740 minutes. Finally, the absorbance of 1,4-dinitrobenezene/THF solution remained at about 98.8 percent of its initial value over a period of about 480 minutes, giving an estimated half-life time of about 10400 minutes. These spectroscopic results again demonstrate the stabilization effects of electron acceptor compounds on p-type semiconductors.

What is claimed is:

1. A process for fabricating an electronic device comprising:
   (a) forming a liquid composition using starting ingredients comprising an n-type organic semiconductor selected from the group consisting of α,ω-di(perfluoroalkyl)substituted oligothiophenes, α,ω-diacyl substituted oligothiophenes, and metal perfluorophthalocyanines, and mixtures thereof and a stabilizer, wherein the stabilizer comprises a strong electron donor compound selected from the group consisting optionally substituted triarylamines, tetrathiafulvalene and its derivatives, optionally substituted polythiophenes, poly(3,4-ethylenedioxythiophene), 4,4'-bis(carbazol-9-yl)-biphenyl, poly(N-vinylcarbazole), polyaniline, and mixtures thereof, wherein the organic semiconductor exhibits a high oxygen sensitivity in a comparison solution without the stabilizer but a lower oxygen sensitivity in the liquid composition;
   (b) liquid depositing the liquid composition; and
   (c) drying the liquid composition to form a layer of the electronic device, wherein the layer comprises the organic semiconductor.

2. The process of claim 1, wherein the strong electron donor compound has an ionization potential ranging from about 3.5 eV to about 7 eV.

3. The process of claim 1, wherein the strong electron acceptor compound has an electron affinity ranging from about 0.4 eV to about 4 eV.

4. The process of claim 1, wherein the high oxygen sensitivity is defined by a half-life time of less than 200 minutes and the lower oxygen sensitivity is defined by a half-life time of more than 200 minutes.

5. The process of claim 1, wherein the n-type organic semiconductor is present in an amount from about 0.5 percent to about 80 percent by weight of the liquid composition, and the strong electron donor compound is present in an amount from about 0.5 percent to about 99.5 percent by weight of the liquid composition.

6. The process of claim 1, wherein the n-type organic semiconductor is selected from the group consisting of α,ω-diperfluorohexylquaterthiophene, α,ω-diperfluorohexylquinquethiophene, α,ω-diperfluorohexylsexithiophene, α,ω-diheptanoylquaterthiophene, α,ω-diperfluorohexylcarbonylquaterthiophene, perylenetetracarboxylic diimide, copper (II) perfluorophthalocyanine, and mixtures thereof.

7. The process of claim 1, wherein the organic semiconductor ranges from about 1 percent to about 50 percent by weight of the liquid composition and the stabilizer ranges from about 0.5 percent to about 98 percent by weight of the liquid composition.

8. The process of claim 1, wherein the liquid depositing is accomplished by a method selected from the group consisting of spin coating, dip coating, blade coating, jet printing, screen printing, stencil printing, microcontact printing, stamping, gravure printing, and flexography.

9. A process for fabricating an electronic device comprising:
   (a) forming a liquid composition using starting ingredients comprising a p-type organic semiconductor and a strong electron acceptor compound, wherein the p-type organic semiconductor comprises a 6,13 substituted pentacene selected from the group consisting of 6,13-dihexylpentacene, 6,13-dioctylpentacene, 6,13-didodecylpentacene, 6,13-diphenylpentacene, 6,13-bis(4-butylphenyl) pentacene, 6,13-bis(4-hexylphenyl)pentacene, 6,13-bis (4-octylphenyl)pentacene and exhibits a high oxygen sensitivity in a comparison solution without the strong electron acceptor compound but a lower oxygen sensitivity in the liquid composition;
   (b) liquid-depositing the liquid composition; and
   (c) drying the liquid composition to form a layer of the electronic device, wherein the layer comprises the p-type organic semiconductor.

10. The process of claim 9, wherein the strong electron acceptor compound has an electron affinity ranging from about 0.4 eV to about 4 eV.

11. The process of claim 9, wherein the high oxygen sensitivity is defined by a half-life time of less than 200 minutes and the lower oxygen sensitivity is defined by a half-life time of more than 200 minutes.

12. The process of claim 9,
   wherein the strong electron acceptor compound is selected from the group consisting of nitrobenzene, fluoronitrobenzene, difluoronitrobenzene, trifluoronitrobenzene, chloronitrobenzene, chlorofluorobenzene, dichloronitrobenzene, nitrotrifluoromethylbenzene, ethylnitrobenzene, dimethylnitrobenzene, dinitrobenzene, chloronitrotoluene, nitrotoluene, fluoronitrotoluene, dinitrotoluene, nitrobenzonitrile, tetracyanoethylene, 7,7,8,8-tetracyanoquinodimethane, phthalic anhydride, nitrobenzaldehyde, and mixtures thereof.

13. The process of claim 9, wherein the p-type organic semiconductor ranges from about 2 percent to about 50 percent by weight of the liquid composition and the strong electron acceptor compound ranges from about 50 percent to about 98 percent by weight of the liquid composition.

14. The process of claim 9, wherein the liquid depositing is accomplished by a method selected from the group consisting of spin coating, dip coating, blade coating, jet printing, screen printing, stencil printing, microcontact printing, stamping, gravure printing, and flexography.

15. A process for fabricating a semiconductor layer of a thin film transistor comprising:
(a) forming a liquid composition using starting ingredients comprising a p-type organic semiconductor and a strong electron acceptor compound, wherein the p-type organic semiconductor comprises a 6,13 substituted pentacene selected from the group consisting of 6,13-dihexylpentacene, 6,13-dioctylpentacene, 6,13-didodecylpentacene, 6,13-diphenylpentacene, 6,13-bis(4-butylphenyl)pentacene, 6,13-bis(4-hexylphenyl)pentacene, 6,13-bis(4-octylphenyl)pentacene and exhibits a high oxygen sensitivity in a comparison solution without the stabilizer but a lower oxygen sensitivity in the liquid composition;
(b) liquid depositing the liquid composition; and
(c) drying the liquid composition to form the semiconductor layer of the thin film transistor, wherein the semiconductor layer comprises the p-type organic semiconductor.

16. The process of claim 15, wherein the strong electron acceptor compound has an electron affinity ranging from about 0.4 eV to about 4 eV.

17. The process of claim 15, wherein the high oxygen sensitivity is defined by a half-life time of less than 200 minutes and the lower oxygen sensitivity is defined by a half-life time of more than about 200 minutes.

18. The process of claim 15, wherein the strong electron acceptor compound is selected from the group consisting of nitrobenzene, fluoronitrobenzene, difluoronitrobenzene, trifluoronitrobenzene, chloronitrobenzene, chlorofluorobenzene, dichloronitrobenzene, nitrotrifluoromethylbenzene, ethylnitrobenzene, dimethylnitrobenzene, dinitrobenzene, chloronitrotoluene, nitrotoluene, fluoronitrotoluene, dinitrotoluene, nitrobenzonitrile, tetracyanoethylene, 7,7,8,8-tetracyanoquinodimethane, phthalic anhydride, nitrobenzaldehyde, and mixtures thereof.

* * * * *

UNITED STATES PATENT AND TRADEMARK OFFICE
CERTIFICATE OF CORRECTION

PATENT NO. : 7,651,885 B2 Page 1 of 1
APPLICATION NO. : 11/303535
DATED : January 26, 2010
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 435 days.

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

PATENT NO.          : 7,651,885 B2
APPLICATION NO.     : 11/303535
DATED               : January 26, 2010
INVENTOR(S)         : Yuning Li et al.

It is certified that error appears in the above-identified patent and that said Letters Patent is hereby corrected as shown below:

In the Specification:

Column 1, line 8, after "Cooperative Agreement No.", please delete "70NANBOH3033" and insert -- 70NANB0H3033 --.

Signed and Sealed this
Tenth Day of September, 2013

Teresa Stanek Rea
*Acting Director of the United States Patent and Trademark Office*